United States Patent [19]

Murata et al.

[11] Patent Number: 5,580,695
[45] Date of Patent: Dec. 3, 1996

[54] CHEMICALLY AMPLIFIED RESIST

[75] Inventors: Makoto Murata; Takao Miura; Yoshiji Yumoto; Toshiyuki Ota; Eiichi Kobayashi, all of Yokkaichi, Japan

[73] Assignee: Japan Synthetic Rubber Co., Ltd., Tokyo, Japan

[21] Appl. No.: 339,289

[22] Filed: Nov. 10, 1994

Related U.S. Application Data

[63] Continuation of Ser. No. 19,871, Feb. 19, 1993, abandoned.

[30] Foreign Application Priority Data

Feb. 25, 1992 [JP] Japan .................................. 4-073169
Apr. 10, 1992 [JP] Japan .................................. 4-116722

[51] Int. Cl.$^6$ .............................. G03C 1/73; G03F 7/038
[52] U.S. Cl. ................... 430/270.1; 430/325; 430/917; 430/920; 522/31; 522/78; 522/126; 522/129
[58] Field of Search .................................. 430/270, 909, 430/910, 191, 192, 193, 917, 920, 325; 522/126, 31, 78, 129

[56] References Cited

U.S. PATENT DOCUMENTS

| | | | |
|---|---|---|---|
| 3,779,778 | 12/1973 | Smith et al. | 430/270 |
| 4,544,627 | 10/1985 | Takahashi et al. | 430/325 |
| 4,708,925 | 11/1987 | Newman | 430/270 |
| 4,810,613 | 3/1989 | Osuch et al. | 430/270 |
| 4,904,564 | 2/1990 | Chiong | 430/191 |
| 4,931,381 | 6/1990 | Spak et al. | 430/191 |
| 5,120,629 | 6/1992 | Bauer et al. | 430/270 |
| 5,212,046 | 5/1993 | Lamola et al. | 430/270 |
| 5,286,599 | 2/1994 | Babich et al. | 430/270 |
| 5,286,600 | 2/1994 | Ochiai et al. | 430/270 |
| 5,332,650 | 7/1994 | Murata et al. | 430/270 |
| 5,482,816 | 1/1996 | Murata et al. | 430/171 |
| 5,494,777 | 2/1996 | Shiraki et al. | 430/270.1 |

FOREIGN PATENT DOCUMENTS

| | | |
|---|---|---|
| 0212482 | 3/1987 | European Pat. Off. . |
| 0249139 | 12/1987 | European Pat. Off. . |
| 0316667 | 5/1989 | European Pat. Off. . |
| 0419147 | 3/1991 | European Pat. Off. . |
| 0459708 | 12/1991 | European Pat. Off. . |
| 0483693 | 5/1992 | European Pat. Off. ............... 430/270 |
| 0523957 | 1/1993 | European Pat. Off. . |
| 0537524 | 4/1993 | European Pat. Off. . |
| 3831290 | 4/1989 | Germany . |
| 4124426 | 1/1992 | Germany . |
| 2-161436 | 6/1990 | Japan .................................... 430/909 |

OTHER PUBLICATIONS

Solid State Technology, vol. 34, No. 8, Aug. 1991, pp. 53–60, A. A. Lamola, et al., "Chemically Amplified Resists".

Primary Examiner—Janis L. Dote
Attorney, Agent, or Firm—Oblon, Spivak, McClelland, Maier & Neustadt, P.C.

[57] ABSTRACT

A chemically amplified resist comprising an alkali-soluble resin or a resin having at least one acid-dissociable group which is alkali-insoluble or -sprairingly soluble but becomes alkali-soluble upon dissociation of said acid dissociable group due to an acid; a radiation-sensitive, acid-generating agent; and an optional component in which resist, the radiation-sensitive, acid-generating agent generates an acid upon irradiation with a radiation in the irradiated portion and the solubility of the resin component and optional component in a developing solution is varied in the irradiated portion by a chemical reaction caused by the catalytic action of the acid, whereby a pattern is formed, characterized in that a compound having a nitrogen-containing basic group is contained in the resist. Said resist is superior in developability, pattern form, resolution, focus tolerance and yield of residual film thickness, has good process stability, and can be suitably used even in irradiation with, in particular, a radiation having a wavelength equal to or smaller than far ultraviolet rays, for example, an excimer laser or the like.

10 Claims, No Drawings

CHEMICALLY AMPLIFIED RESIST

This application is a Continuation of application Ser. No. 08/019,871, filed on Feb. 19, 1993, now abandoned.

The present invention relates to a chemically amplified resist, and more particularly, to a chemically amplified resist suitable as a resist for micro engineering using, in particular, a radiation such as far ultraviolet rays, for example, an excimer laser or the like.

In the field of micro engineering, a representative of which is fabrication of integrated circuit elements, the size of pattern to be formed in lithography is increasingly becoming finer in order to obtain an integrated circuit of higher packing density. In recent years, a technique has become necessary which can conduct the micro engineering of 0.5 μm or less stably. This requires a resist capable of forming a pattern of 0.5 μm or less with high precision. Formation of a pattern of 0.5 μm or less with high precision, however, is very difficult with conventional techniques using a visible light (700–400 nm) or near ultraviolet rays (400–300 nm). Hence, a lithography technique using a radiation having a shorter wavelength (shorter than 300 nm) is under study.

Such shorter radiations include far ultraviolet rays, typical examples of which are bright line spectrum (254 nm) emitted from mercury lamp, KrF excimer laser (248 nm) and the like; X rays; electron beam; etc. Of these excimer laser is drawing special attention. Further, the resist used in said lithography must satisfy the following various requirements: the resist must be such that a pattern of 0.5 μm or less having a good profile is formed with high sensitivity and high resolution using an excimer laser, which pattern is excellent in such properties as focus tolerance (a good pattern is obtained even when deviation in focussing occurs during the application of a radiation), developability (neither scums nor undeveloped portions remain during development), yield of residual film thickness (no film erosion occurs during development) and adhesiveness (no stripping of resist pattern occurs during development).

Chemically amplified resist has recently been proposed which can generate an acid upon irradiation, the catalytic action of which acid can increase the sensitivity of the resist. Said chemically amplified resist comprises an alkali-soluble resin or a resin having at least one acid-dissociable group which is alkali-insoluble or -sparingly soluble but becomes alkali-soluble upon dissociation of said group due to an acid, a radiation-sensitive, acid-generating agent (referred to hereinafter simply as the acid-generating agent) and an optional component, in which resist, the acid-generating agent generates an acid upon irradiation with a radiation in the irradiated portion and the solubility of the resin component and optional component in a developing solution is varied in the irradiated portion by a chemical reaction caused by the catalytic action of the acid, whereby a pattern is formed. The chemically amplified resist generally has good sensitivity, but has such problems in respect of process stability that its performance is greatly varied depending upon the length of time from irradiation to development and the heating temperature after the irradiation.

In order to solve these problems, M. Murata et al. have proposed a radiation-sensitive resin composition comprising a polymer having an acid-decomposable silyl group, a radiation-sensitive, acid-generating agent and a nitrogen-containing weakly basic compound (U.S. patent application Ser. No. 07/912,848 or European Patent Application No. 92306441.4).

The present inventors have found that the above problems can also be solved by incorporating a compound having a nitrogen-containing basic group into the chemically amplified resist.

An object of the present invention is to provide a novel chemically amplified resist.

Another object of the present invention is to provide a chemically amplified resist which enables stable micro engineering, has high sensitivity and high resolution, gives a good pattern profile, is superior in focus tolerance, developability, yield of residual film thickness and adhesiveness, and has good process stability and which is suitably used as a resist.

Other objects and advantages of the present invention will become apparent from the following description.

According to the present invention, there is provided a chemically amplified resist comprising the above-mentioned conventional chemically amplified resist and a compound having a nitrogen-containing basic group.

The conventional chemically amplified resist includes:
(A) a chemically amplified resist [referred to hereinafter as Resist (A)] comprising:

(1) an alkali-soluble resin [referred to hereinafter as Resin (A)], (2) an acid-generating agent, and (3) a compound which has an effect of controlling the alkali-solubility of Resin (A) and exhibits, when it is decomposed in the presence of an acid, such properties that the effect of its controlling the alkali-solubility of Resin (A) is reduced or lost or the alkali-solubility of Resin (A) is promoted [said compound (3) is referred to hereinafter as the solubility-controlling agent], (B) a chemically amplified resist [referred to hereinafter as Resist (B)] comprising:

(1) an alkali-insoluble or -sparingly soluble resin having at least one acid-dissociable group selected from the group consisting of substituted methyl groups, 1-substituted ethyl groups, germyl groups, alkoxycarbonyl groups and acyl groups, said resin becoming alkali-soluble upon dissociation of the group due to an acid, and (2) the acid-generating agent, and (C) a chemically amplified resist [referred to hereinafter as Resist (C)] comprising:

(1) Resin (A), (2) the acid-generating agent, and (3) a compound capable of cross-linking Resin (A) in the presence of an acid [said compound is referred to hereinafter as the cross-linking agent].

The components contained in Compositions (A), (B) and (C) are described in more detail below.

Resin (A)

Resin (A), which is used in Resist (A) and (C), may be any resin which is soluble in an alkali developing solution.

Resin (A) may, therefore, be any resin having a functional group having a compatibility with an alkali developing solution such as phenolic hydroxyl group, carboxyl group or the like. Preferable examples of Resin (A) include resins each having at least one repeating unit selected from the group consisting of:

a repeating unit represented by formula (1):

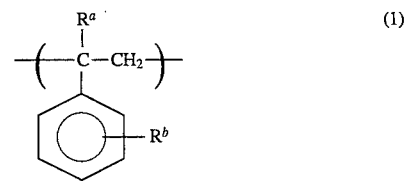

wherein $R^a$ is a hydrogen atom or a methyl group; $R^b$ is a hydroxyl group, a carboxyl group, —$R^c$COOH, —O$R^c$COOH or

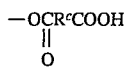

(in which $R^c$ is —$(CH_2)_n$—; and n is an integer of 1–4, a repeating unit represented by formula (2):

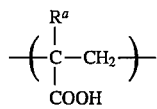 (2)

wherein $R^a$ is as defined in formula (1), a repeating unit represented by formula (3):

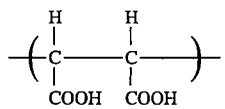 (3)

and a repeating unit represented by formula (4):

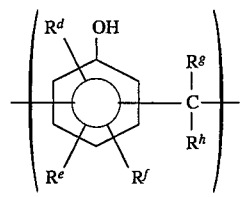 (4)

wherein $R^d$, $R^e$, $R^f$, $R^g$ and $R^h$ are the same as or different from one another and each thereof is a hydrogen atom or an alkyl group having 1–4 carbon atoms.

Resin (A) may be composed only of the repeating unit represented by formula (1), formula (2), formula (3) or formula (4), or may further have at least one other repeating unit. The at least one other repeating unit which may be used together with the repeating unit of formula (1), (2) or (3) includes repeating units formed by the cleavage of the double bonds of double bond-containing monomers such as styrene, methylstyrene, $C_{1-4}$ alkyl acrylates, $C_{1-4}$ alkyl methacrylates, maleic anhydride, fumaronitrile, acrylamide, acrylonitrile, vinylpyridine, vinylpyrrolidone, vinylimidazole, vinylaniline and the like.

The content of the repeating units represented by formula (1), formula (2), formula (3) and formula (4) in Resin (A) cannot be uniquely specified because it varies depending upon the content of said at least one other repeating unit, but it is preferably 15 mole % or more, more preferably 20 mole % or more.

The molecular weight of Resin (A) is preferably 1,000–150,000, particularly preferably 3,000–100,000 in terms of polystyrene-reduced weight-average molecular weight (referred to hereinafter as Mw) as measured by gel permeation chromatography (GPC).

Resin (A) can be produced, for example, by polymerizing a corresponding vinyl monomer or by subjecting a phenol and an aldehyde to polycondensation.

Of various Resins (A), the resin having a repeating unit represented by formula (1) or formula (2) may be used in the form of a hydrogenated product having a hydrogenation degree of 70% or less, preferably 50% or less, more preferably 40% or less.

Resin (B)

Resin (B) used in Resist (B) is an alkali-insoluble or -sparingly soluble resin obtained by substituting at least one acid-dissociable group selected from the group consisting of substituted methyl groups, 1-substituted ethyl groups, germyl groups, alkoxycarbonyl groups and acyl groups for the hydrogen atoms of the acidic functional group of Resin (A) (e.g. phenolic hydroxyl group or carboxyl group). The acid-dissociable group refers to a group which is dissociable in the presence of an acid.

Specific examples of the acid-dissociable group include, as the substituted methyl group, methoxymethyl group, methylthiomethyl group, methoxyethoxymethyl group, tetrahydropyranyl group, tetrahydrofuryl group, tetrahydrothiofuryl group, tetrahydrothiopyranyl group, benzyloxymethyl group, phenacyl group, bromophenacyl group, methoxyphenacyl group, α-methylphenacyl group, cyclopropylmethyl group, cyclohexyl group, cyclopentyl group, benzyl group, triphenylmethyl group, diphenylmethyl group, bromobenzyl group, nitrobenzyl group, methoxybenzyl group, piperonyl group, etc.; as the 1-substituted ethyl group, 1-methoxyethyl group, 1-ethoxyethyl group, isopropyl group, tert-butyl group, 1,1-dimethylpropyl group, etc.; as the germyl group, trimethylgermyl group, triethylgermyl group, tert-butyldimethylgermyl group, isopropyldimethylgermyl group, phenyldimethylgermyl group, etc.; as the alkoxycarbonyl group, methoxycarbonyl group, ethoxycarbonyl group, tert-butoxycarbonyl group, etc.; and as the acyl group, acetyl group, propionyl group, butyryl group, heptanoyl group, hexanoyl group, valeryl group, pivaloyl group, isovaleryl group, laurolyl group, myristoyl group, palmitoyl group, stearoyl group, acryloyl group, propioloyl group, methacryloyl group, crotonoyl group, oleoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, etc.

Of these, preferable is tert-butyl group, benzyl group, tetrahydrofuryl group, tetrahydropyranyl group, tetrahydrothiofuryl group, tetrahydrothiopyranyl group or tert-butoxycarbonyl group.

The introduction of the acid-dissociable group is conducted via the acidic functional group of Resin (A). The acid-dissociable group is introduced in a proportion of preferably 15–100%, more preferably 20–80% based on the total acidic functional group of Resin (A). The molecular weight of Resin (B) is preferably 1,000–150,000, more preferably 3,000–100,000 in terms of Mw as measured by GPC.

Resin (B) is alkali-insoluble or -sparingly soluble. The term "alkali-sparingly soluble" used herein refers to such a property of Resin (B) that when under the suitable alkalis-developing conditions used in the formation of a pattern on a resist film formed from Resist (B), a film formed from only Resin (B) in place of the said resist film is subjected to alkali-development in the same manner, Resin (B) remains in a film thickness of 50% or more of the initial film thickness after the development treatment.

Acid-generating agent

The radiation-sensitive, acid-generating agent (a compound which generates an acid upon irradiation with a radiation) used in the present invention, i.e. the acid-generating agent, is, for example, an onium salt, a halogen-containing compound, a quinonediazide compound, a sulfone compound, a sulfonic acid compound, a nitrobenzyl compound or the like, and includes specifically the following compounds:

Onium salts: Iodonium salts, sulfonium salts, phosphonium salts, diazonium salts, pyridinium salts, etc., preferably compounds represented by formula (5):

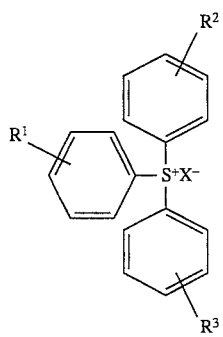

(5)

wherein $R^1$, $R^2$ and $R^3$ are the same as or different from one another and each thereof is a hydrogen atom, an amino group, a nitro group, a cyano group, an alkyl group having 1–4 carbon atoms or an alkoxy group having 1–4 carbon atoms, and X is $SbF_6$, $AsF_6$, $PF_6$, $BF_4$, $CF_3CO_2$, $ClO_4$, $CF_3SO_3$,

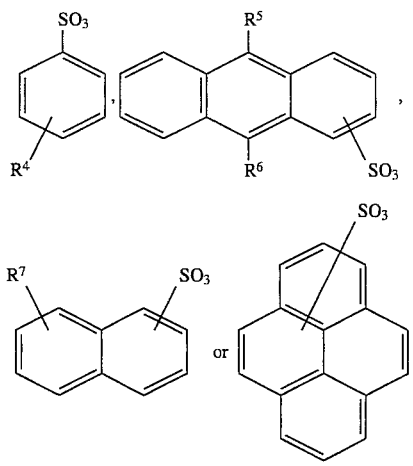

($R^4$ is a hydrogen atom, an amino group, an anilino group, an alkyl group having 1–4 carbon atoms, an alkoxy group having 1–4 carbon atoms, and each of $R^5$ and $R^6$ is an alkoxy group having 1–4 carbon atoms, and $R^7$ is a hydrogen atom, an amino group, an anilino group, an alkyl group having 1–4 carbon atoms or an alkoxy group having 1–4 carbon atoms), compounds represented by formula (6):

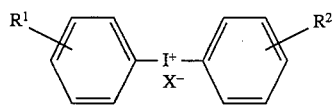

(6)

wherein $R^1$, $R^2$ and X are as defined in formula (5), and compounds represented by formula (7):

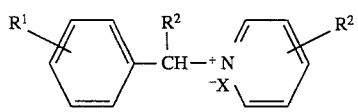

(7)

wherein $R^1$, $R^2$, $R^3$ and X are as defined in formula (5).

Halogen-containing compounds: Haloalkyl-containing hydrocarbon compounds, haloalkyl-containing heterocyclic compounds, etc., preferably compounds represented by formula (8):

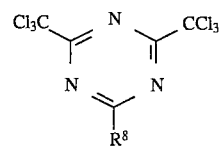

(8)

wherein $R^8$ is a trichloromethyl group, a phenyl group, a methoxyphenyl group, a naphthyl group or a methoxynaphthyl group, and compounds represented by formula (9):

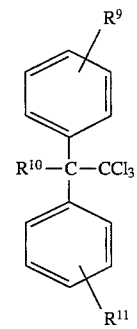

(9)

wherein $R^9$, $R^{10}$ and $R^{11}$ are the same as or different from one another and each thereof is a hydrogen atom, a halogen atom, a methyl group, a methoxy group or a hydroxyl group.

Quinonediazide compounds: Diazobenzoquione compounds, diazonaphthoquinone compounds, etc., preferably compounds represented by formula (10):

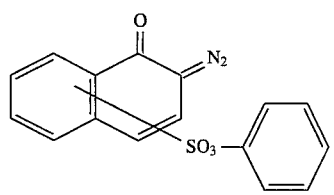

(10)

compounds represented by formula (11):

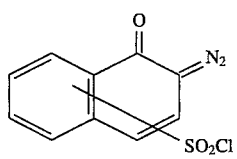

(11)

compounds represented by formula (12):

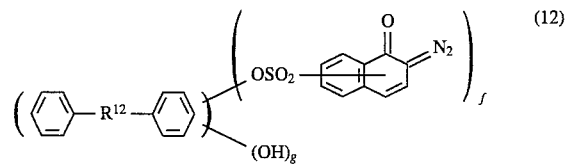

(12)

wherein $R^{12}$ is $-CH_2-$, $-C(CH_3)_2-$, $-C-$ or $-SO_2-$,

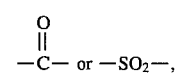

$-C-$ or $-SO_2-$, f is an integer of 1–6 and g is an integer of 0–5 with the total of f and g being 1–6, and compounds represented by formula (13):

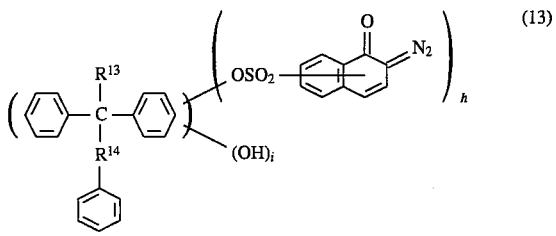

wherein $R^{13}$ is a hydrogen atom or a methyl group, $R^{14}$ is —CH$_2$—, —C(CH$_3$)$_2$—,

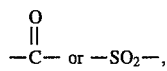

h is an integer of 1–6 and i is an integer of 0–5 with the total of h and i being 1–6.

Sulfone compounds: β-Ketosulfones, β-sulfonylsulfones, etc., preferably compounds represented by formula (14):

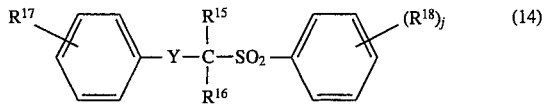

wherein Y is

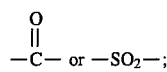

$R^{15}$, $R^{16}$, $R^{17}$ and $R^{18}$ are the same as or different from one another and each thereof is an alkyl group having 1–4 carbon atoms or a halogen atom, and j is an integer of 0–3.

Nitrobenzyl compounds: Nitrobenzylsulfonate compounds, dinitrobenzylsulfonate compounds, etc., preferably compounds represented by formula (15):

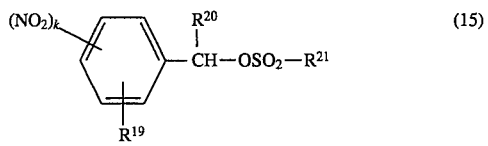

wherein $R^{19}$ is an alkyl group having 1–4 carbon atoms; $R^{20}$ is a hydrogen atom or a methyl group; $R^{21}$ is

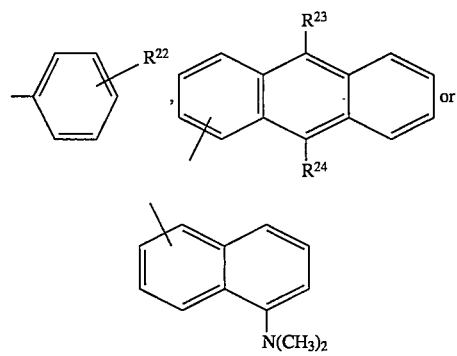

($R^{22}$ is a hydrogen atom or a methyl group, $R^{23}$ and $R^{24}$ are the same as or different from each other and each thereof is an alkoxy group having 1–4 carbon atoms); and k is an integer of 1–3.

Sulfonic acid compounds: Alkylsulfonic acid esters, haloalkylsulfonic acid esters, arylsulfonic acid esters, iminosulfonates, etc., preferably compounds represented by formula (16):

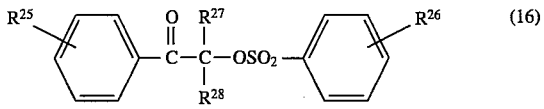

wherein $R^{25}$ and $R^{26}$ are the same as or different from each other and each thereof is a hydrogen atom or an alkyl group having 1–4 carbon atoms, and $R^{27}$ and $R^{28}$ are the same as or different from each other and each thereof is a hydrogen atom, an alkyl group having 1–4 carbon atoms or an aryl group having 6–20 carbon atoms, compounds represented by formula (17):

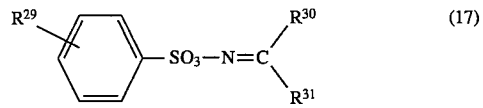

wherein $R^{29}$ is a hydrogen atom or an alkyl group having 1–4 carbon atoms, and $R^{30}$ and $R^{31}$ are the same as or different from each other and each thereof is an alkyl group having 1–4 carbon atoms or an aryl group having 6–20 carbon atoms, provided that $R^{30}$ and $R^{31}$ may be bonded to each other to form a ring together with the carbon atom to which they attach, compounds represented by formula (18):

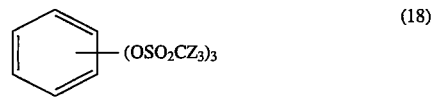

wherein Z is an alkyl group having 1–4 carbon atoms, an aryl group having 6–20 carbon atoms, a hydrogen atom, a fluorine atom or a chlorine atom.

Of these compounds, onium salts and quinonediazide compounds are particularly preferred.

The amount of the acid-generating agent added is preferably 1–70 parts by weight, more preferably 3–50 parts by weight, most preferably 3–20 parts by weight, per 100 parts by weight of Resin (A) or Resin (B). When the amount is less than 1 part by weight, it is difficult to obtain a sufficient pattern-forming ability, and when it exceeds 70 parts by weight, scums tend to be formed.

Solubility-controlling agent

The solubility-controlling agent is used in Composition (A). The solubility-controlling agent has an effect of its controlling the alkali-solubility of Resin (A) and exhibits, when it is decomposed, e.g. hydrolyzed, in the presence of an acid, such properties that the effect of controlling the alkali-solubility of Resin (A) is reduced or lost or the alkali-solubility of Resin (A) is promoted.

The solubility-controlling agent includes, for example, compounds each having an acidic, functional group having attached thereto a substituent capable of being liberated in the presence of an acid. The substituent includes, for example, the acid-dissociable groups mentioned as to Resin (B) and a silyl group. Specific examples of the silyl group include trimethylsilyl, triethylsilyl, tert-butyldimethylsilyl, isopropyldimethylsilyl and phenyldimethylsilyl. However, the silyl group is not restricted to these examples.

The solubility-controlling agent may be a low-molecular-weight compound or a high-molecular-weight compound and includes, for example, compounds represented by formula (19):

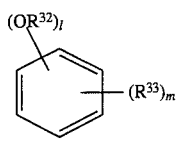

wherein when plural $R^{32}$'s are present, they are the same as or different from one another and each thereof is a group selected from the group consisting of substituted methyl groups, 1-substituted ethyl groups, germyl groups, silyl groups, alkoxycarbonyl groups and acyl groups; when plural $R^{33}$'s are present, they are the same as or different from one another and each thereof is an alkyl group having 1–4 carbon atoms, a phenyl group or a naphthyl group; each of l and m is an integer of 0 or more satisfying $l+m \leq 6$ and $1 \leq l$, formula (20):

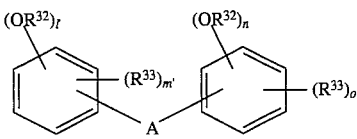

wherein $R^{32}$ and $R^{33}$ are as defined as in formula (19); each of l', m', n and o is an integer of 0 or more and satisfying $l'+m' \leq 5$, $n+o \leq 5$ and $1 \leq l'+n$; and A is a single bond, $$-S-, -O-, -\underset{\underset{O}{\|}}{C}-, -\underset{\underset{O}{\|}}{C}-O-, -\underset{\underset{O}{\|}}{S}-, -\underset{\underset{O}{\|}}{\overset{\overset{O}{\|}}{S}}-,$$

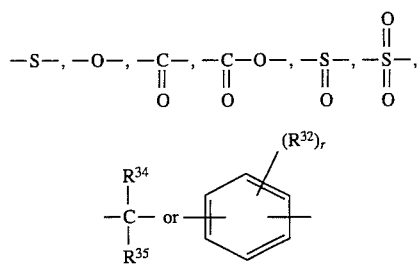

[$R^{32}$ is as defined in formula (19), $R^{34}$ and $R^{35}$ are the same as or different from each other and each thereof is a hydrogen atom, an alkyl group having 1–6 carbon atoms, an acyl group, a phenyl group or a naphthyl group, and r is an integer satisfying $0 \leq r \leq 4$], formula (21):

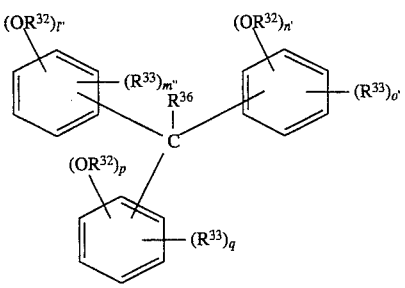

wherein $R^{32}$ and $R^{33}$ are as defined in formula (19), each of l", m'", n', o', p and q is an integer of 0 or more satisfying $l"+m'" \leq 5$, $o'+n' \leq 5$, $p+q \leq 5$ and $1 \leq l"+n'+p$, and $R^{36}$ is an alkyl group having 1–4 carbon atoms or a phenyl group, formula (22):

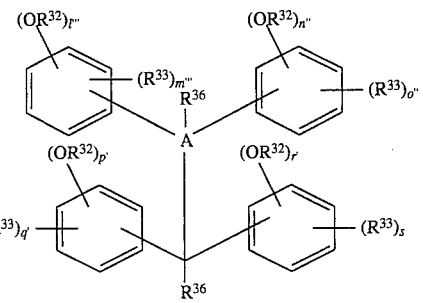

wherein $R^{32}$, $R^{33}$ and $R^{36}$ are as defined in formula (21), each of l'", m'", n", o", p', q', r' and s is an integer of 0 or more satisfying $l'"+m'" \leq 5$, $n"+o" \leq 5$, $p'+q' \leq 5$, $r'+s \leq 5$ and $1 \leq l'"+n"+p'+r'$, and A is a single bond, $$-S-, -O-, -\underset{\underset{O}{\|}}{C}-, -\underset{\underset{O}{\|}}{C}-O-, -\underset{\underset{O}{\|}}{S}-, -\underset{\underset{O}{\|}}{\overset{\overset{O}{\|}}{S}}-,$$

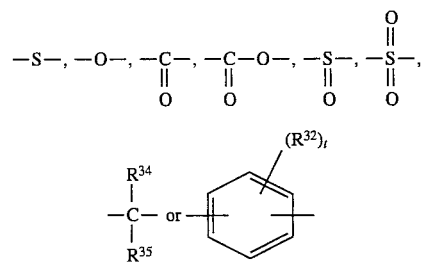

[$R^{32}$ is as defined in formula (20), $R^{34}$ and $R^{35}$ are as defined in formula (20), and t is an integer satisfying $0 \leq t \leq 4$], and formula (23):

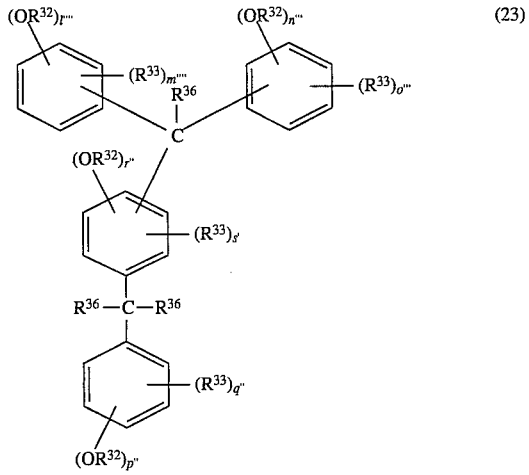

wherein $R^{32}$, $R^{33}$ and $R^{36}$ are as defined in formula (21), and each of l"", m"", n'", o'", p", q", r" and s' is an integer of 0 or more satisfying $l""+m"" \leq 5$, $p"+q" \leq 5$, $n'"+o'" \leq 5$, $r"+s' \leq 4$ and $1 \leq l""+n'"+r"+p"$, and resins (referred to hereinafter as Resin C) obtained by introducing an acid-dissociable group or a silyl group into Resin (A).

The amount of the solubility-controlling agent used is preferably 5–150 parts by weight, more preferably 5–100 parts by weight, per 100 parts by weight of Resin (A).

Cross-linking agent

The cross-linking agent is used in Composition (C). The cross-linking agent is a compound capable of cross-linking Resin (A) in the presence of an acid, for example, an acid generated by irradiation with a radiation.

The cross-linking agent may be any compound having the above-mentioned properties and is not critical. It includes, as preferable examples, aromatic compounds each having a cross-linkable substituent, such as aromatic compounds each having a —$C(R^{37}R^{38})$—$OR^{39}$ group wherein $R^{37}$ and $R^{38}$ are the same as or different from each other and each thereof represents a hydrogen atom or an alkyl group having 1–4 carbon atoms; and $R^{39}$ represents a hydrogen atom, an alkyl group having 1–5 carbon atoms, an aralkyl group, a —$NR^{40}R^{41}$ group in which $R^{40}$ and $R^{41}$ are the same as or different from each other and each thereof represents an alkyl group having 1–4 carbon atoms or a cyclic ring having 3–8 atoms containing or not containing hetero atoms or a —$COR^{42}$ group in which $R^{42}$ represents an alkyl group having 1–4 carbon atoms or an aryl group having 6–14 carbon atoms; aromatic compounds each having a —CO—$R^{43}$ group wherein $R^{43}$ represents a hydrogen atom or an alkyl group having 1–4 carbon atoms; aromatic compounds each having a —$CR^{44}$=$CR^{45}R^{46}$ group wherein $R^{44}$, $R^{45}$ and $R^{46}$ are the same as or different from one another and each thereof represents a hydrogen atom or an alkyl group having 1–4 carbon atoms; and aromatic compounds each having a —$C(R^{47}R^{48})R^{49}$ group wherein $R^{47}$ and $R^{48}$ are the same as or different from each other and each thereof represents a hydrogen atom or an alkyl group having 1–4 carbon atoms, and $R^{49}$ represents a 3-membered heterocyclic group having 2–5 carbon atoms in which the heterocyclic ring consists of two carbon atoms and an oxygen or bivalent sulfur atom.

The cross-linkable substituent includes, as specific examples, glycidyl ether group, glycidyl ester group, glycidylamino group, methylol group, methoxymethyl group, ethoxymethyl group, benzyloxymethyl group, dimethylaminomethyl group, diethoxymethylamino group, morpholinomethyl group, acetoxymethyl group, benzoyloxymethyl group, formyl group, acetyl group, vinyl group and isopropenyl group.

The aromatic compounds each having the above cross-linkable substituent include, as specific examples, bisphenol A type epoxy compounds, bisphenol F type epoxy compounds, bisphenol S type epoxy compounds, novolak type epoxy compounds, resol resin type epoxy compounds, polyhydroxystyrene type epoxy compounds, methylol group-containing melamine resins, methylol group-containing benzoguanamine resins, methylol group-containing urea resins, methylol group-containing phenolic resins, methylol group-containing melamine compounds, methylol group-containing phenol compounds, alkoxymethyl($C_{2-5}$) group-containing melamine resins, alkoxymethyl($C_{2-5}$) group-containing benzoguanamine resins, alkoxymethyl($C_{2-5}$) group-containing urea resins, alkoxymethyl($C_{2-5}$) group-containing phenolic resins, alkoxymethyl($C_{2-5}$) group-containing melamine compounds, alkoxymethyl($C_{2-5}$) group-containing phenol compounds, acetoxymethyl group-containing melamine resins, acetoxymethyl group-containing benzoguanamine resins, acetoxymethyl group-containing urea resins, acetoxymethyl group-containing phenolic resins, acetoxymethyl group-containing melamine compounds and acetoxymethyl group-containing phenol compounds.

Of these, preferable are methylol group-containing phenolic resins, methylol group-containing phenol compounds, methoxymethyl group-containing melamine compounds, methoxymethyl group-containing phenol compounds and acetoxymethyl group-containing phenol compounds.

As the cross-linking agent, there can also be used advantageously those compounds obtained by modifying Resin (A) with one of the above-mentioned cross-linkable substituents to impart thereto a property as a cross-linking agent. In that case, the proportion of the substituent introduced into Resin (A) is adjusted to preferably 5–60%, more preferably 10–50%, most preferably 15–40%, based on the total amount of the acidic functional groups of Resin (A). When the proportion is less than 5%, it is difficult to cause sufficient cross-linking reaction, and hence, there is a tendency that the yield of residual film thickness is reduced, a curved pattern is formed and swelling is caused. When the proportion is more than 60%, the alkali-solubility of Resin (A) is reduced, and hence, there is a tendency that the developability is deriorated.

The amount of the cross-linking agent used is preferably 5–95 parts by weight, more preferably 15–85 parts by weight, most preferably 20–75 parts by weight, per 100 parts by weight of Resin (A). When the amount is less than 5 parts by weight, it is difficult to cause sufficient cross-linking reaction, and hence, there is a tendency that the yield of residual film thickness is reduced, a curved pattern is formed and swelling is caused. When the amount is more than 95 parts by weight, much scum is formed, and hence, there is a tendency that the developability is deteriorated.

Compound having a nitrogen-containing basic group

The compound having a nitrogen-containing basic group used in the present invention is a weakly basic compound preferably having, in the molecule, at least one structure selected from the structures represented by formulas (24) to (28):

wherein $R^{50}$, $R^1$ and $R^{52}$ are the same as or different from one another and each thereof is a hydrogen atom, an alkyl group having 1–6 carbon atoms, an aminoalkyl group having 1–6 carbon atoms, a hydroxyalkyl group having 1–6 carbon atoms or a substituted or unsubstituted aryl group having 6–20 carbon atoms (with the proviso that $R^{51}$ and $R^{52}$ may be bonded to each other to form a heterocyclic ring together with the nitrogen atom to which they attach,

and

wherein $R^{53}$, $R^{54}$, $R^{55}$ and $R^{56}$ are the same as or different from one another and each thereof represents an alkyl group having 1–6 carbon atoms.

Specific examples of the compound having the structure represented by formula (24) in the molecule include ammonia, triethylamine, tripropylamine, tributylamine, aniline, N-methylaniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidine, piperidine and the like.

Specific examples of the compound having the structure represented by formula (25) in the molecule include imidazole, 4-methylimidazole, 4-methyl-2-phenylimidazole, thiabendazole (another name for 2-(4-thiazolyl)benzimidazole), 4,5-diphenylimidazole, 2,4,5-triphenylimidazole and the like.

Specific examples of the compound having the structure represented by formula (26) in the molecule include pyridine, 2-methylpyridine, 4-ethylpyridine, 1-methyl-4-phenylpyridine, 2-(1-ethylpropyl)pyridine, nicotinamide, dibenzoylthiamine, riboflavine tetrabutyrate and the like.

Specific examples of the compound having the structure represented by formula (27) in the molecule include 4,4'-diaminodiphenylmethane, 4,4'-diaminodiphenyl ether, 3,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis-[1-(4-aminophenyl)-1-methylethyl]benzene, 1,3-bis-[1-(4-aminophenyl)-1-methylethyl]benzene and the like.

Specific examples of the compound having the structure represented by formula (28) in the molecule include dimethyl succinate-1-(2-hydroxyethyl)-4-hydroxy-2,2,6,6-tetramethylpiperidine polycondensate, poly{[6-(1,1,3,3-tetramethylbutyl)imino-1,3,5-triazine-2,4-diyl][(2,2,6,6-tetramethyl-4-piperidyl)imino]hexametylene[(2,2,6,6-tetramethyl-4-piperidyl)imino]} and bis(1,2,2,6,6-pentamethyl-4-piperidyl) 2-(3,5-di-tert-butyl-4-hydroxybenzyl)-2-n-butylmalonate.

The compound having a nitrogen-containing basic group used in the present invention may be a weakly basic or neutral compound having both nitrogen-containing basic group and an acidic group. This weakly basic or neutral compound is preferably a compound having, in the molecule, at least one acidic group and at least one structure selected from the structures represented by formulas (25) to (28) mentioned above and formula (29) mentioned below:

$$H-N-H \tag{29}$$

The above acidic group is preferably carboxyl group, sulfo group or phenolic hydroxyl group.

Specific examples of a compound having a nitrogen-containing basic group and a carboxyl group as an acidic group in the molecule include nicotinic acid, isoleucine, glycine, glutamic acid, threonine, theanine, tryptophane, L-valine, histidine hydrochloride, phenylalanine, methionine, folic acid, lysine, 3-aminopyrazine-2-carboxylic acid and the like.

Specific examples of a compound having a nitrogen-containing basic group and a sulfo group as an acidic group in the molecule include 3-pyridinesulfonic acid and the like.

Specific examples of a compound having a nitrogen-containing basic group and a phenolic hydroxyl group as an acidic group in the molecule include 2-hydroxypyridine, 3-hydroxypyridine, 4-hydroxypyridine, 2-amino-p-cresol, 5-amino-o-cresol, 6-amino-m-cresol and the like.

Of these compounds, particularly preferable are nicotinic acid, 2-hydroxypyridine, 3-hydroxypyridine and 4-hydroxypyridine.

The compound having a nitrogen-containing basic group and an acidic group in the molecule may be used together with an acidic group-free compound having a nitrogen-containing basic group.

The amount of the compound having a nitrogen-containing basic group used is preferably 0.001–10 parts by weight, more preferably 0.01–5 parts by weight, per 100 parts by weight of Resin (A) or Resin (B). When the amount is less than 0.001 part by weight, the resulting radiation-sensitive resin composition tends to be inferior in process stability, shape of pattern obtained and adhesiveness. When the amount is more than 10 parts by weight, the sensitivity tends to be lowered and the developability of unexposed portions tends to be deteriorated.

The resist of the present invention may further comprise various additives if necessary.

The additives include a surfactant for improving, for example, coatability, striation, and developability of radiation-exposed portions after a dried film has been formed. The surfactant includes, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate and polyethylene glycol distearate; and as commercial products, for example, F Top EF 301, EF 303 and EF 352 (products of Shin Akita Kasei K.K.), Megafac F 171 and F 172 (products of DAINIPPON INK & CHEMICALS), Fluorad FC 430 and FC 431 (products of Sumitomo 3M Limited), Asahi Guard AG 710, Surflon S-382, Surflon SC-101, SC-102, SC-103, SC-104, SC-105 and SC-106 (products of Asahi Glass Co., Ltd.), KP 341 (product of Shin-Etsu Chemical Co., Ltd.), and Polyflow No. 75 and No. 95 (products of Kyoeisha Yushikagaku Kogyo K.K.) which are acrylic or methacrylic acid (co)polymers.

The amount of the surfactant used is preferably 2 parts by weight or less per 100 parts by weight of Resin (A) or Resin (B).

Other additives include a halation-suppressing agent, an adhesive for adhesiveness improvement, a storage-stabilizer, a defoaming agent, etc.

The resist of the present invention can be prepared by dissolving Resin (A) or (B), the acid-generating agent and, as necessary, various additives in the respective necessary amounts in a solvent.

The solvent includes, for example, ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, 2-methoxyethyl acetate, 2-ethoxyethyl acetate, propylene glycol monomethyl ether acetate, propylene glycol monoethyl ether acetate, propylene glycol monopropyl ether actate, toluene, xylene, methyl ethyl ketone, 2-heptanone, 3-heptanone, 4-heptanone, cyclohexanone, methyl 2-hydroxypropionate, ethyl 2-hydroxypropionate, ethyl 2-hydroxy-2-methylpropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, 3-methyl-3-methoxybutyl butyrate, ethyl acetate, butyl acetate, methyl acetoacetate, ethyl acetoacetate, methyl 3-methoxypropionate, ethyl 3-ethoxypropionate, methyl pyruvate, ethyl pyruvate, N-methylpyrrolidone, N,N-dimethylformamide, N,N-dimethylacetamide, and the like.

There may be further added, if necessary, a high-boiling solvent such as benzyl ethyl ether, dihexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, r-butyrolactone, ethylene carbonate, propylene carbonate, phenyl Cellosolve acetate or the like.

The resist of the present invention is coated on a substrate such as silicon wafer or the like in the above solution form and dried, to form a resist film. The coating on a substrate is conducted by dissolving the resist in the solvent so that the solid concentration in the resulting solution becomes, for example, 5–50% by weight, filtering the solution, and coating the filtered solution by spin-coating, flow-coating, roll-coating or the like.

The resist film is then partially irradiated with a radiation to form a fine pattern. The radiation used is not critical, and a radiation such as far ultraviolet rays (e.g. excimer laser), X-rays (e.g. synchrotron radiation) or charged particle beam (e.g. electron beam) is appropriately used depending upon the kind of the acid-generating agent used. The irradiation conditions such as exposure and the like may be varied appropriately depending upon, for example, the compounding recipe of composition and the kinds of additives used therein.

In the present invention, heating is preferably conducted after the irradiation with a radiation in order to enhance the apparent sensitivity of resist, etc. The heating conditions vary depending upon the compounding recipe of resist, the kinds of additives used therein, etc. but the heating temperature is preferably 30°–200° C., more preferably 50°–150° C.

As a developing solution in the subsequent development step, there may be used, in order to obtain a resist pattern, for example, an aqueous alkaline solution prepared by dissolving in water sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, 1,5-diazabicyclo[4.3.0]-5-nonane or the like.

An aqueous alkaline solution obtained by adding, to the above-mentioned developing solution, appropriate amounts of a water-soluble organic solvent such as an alcohol (e.g. methanol, ethanol on the like) or the like and a surfactant can also be used as a developing solution.

The chemically amplified resist of the present invention is superior in developability, shape of pattern obtained, resolution, adhesiveness, focus tolerance and yield of residual film thickness, has good process stability, and is suitably used even for irradiation with a radiation having a wavelength equal to or shorter than that of far ultraviolet rays, for example, excimer laser, in particular.

The present invention is described in more detail below referring to Examples. However, the present invention is not restricted to these Examples.

In the Examples, measurements and evaluations of properties were made as follows.

Optimum exposure

Exposure necessary for forming a line-and-space pattern of 0.4 μm as designed was determined.

Resolution

Minimum isolated line and space size at the optimum exposure was determined.

Shape of pattern

The lower side length A and the upper side length B of the tetragonal cross-section of a resist pattern were measured using a scanning electron microscope. The shape of the pattern was rated as "good" when $0.85 \leq B/A \leq 1$.

Focus tolerance

Determined was the maximum distance of focus deviation at which the above-mentioned good pattern was maintained when exposure was made varying the focus of a stepper.

Process stability

After the resist film was allowed to stand for 2 hours after exposure, it was subjected to after-exposure baking, and optimum exposure and shape of pattern were determined.

Adhesiveness

The degree of stripping of resist pattern was examined using a scanning electron microscope. No stripping was evaluated as good and the other as bad.

Mw

Using a GPC column manufactured by Toso (consisting of two $G2000H_{XL}$ columns, one $G3000H_{XL}$ column and one $G4000H_{XL}$ column), Mw was measured by a gel permeation chromatography using a monodisperse polystyrene as a standard under the analytical conditions that the flow rate was 1.0 ml/min, tetrahydrofuran was used as an eluent and the column temperature was 40° C.

Mn refers to a polystyrene-reduced number-average molecular weight hereinafter.

EXAMPLE 1

In tetrahydrofuran was dissolved 30 g of a poly(hydroxystyrene). To the resulting solution was added 10 g of potassium tert-butoxide. To the mixture was dropwise added 75 g of di-tert-butyl dicarbonate at 0° C. with stirring. The resulting mixture was subjected to reaction for 6 hours. After completion of the reaction, the reaction mixture was dropwise added to water to precipitate a polymer. The polymer was separated and dried overnight at 50° C. in a vacuum dryer. The polymer had a Mw of 30,000 and a Mw/Mn of 1.60. NMR analysis indicated that the polymer had a structure in which 63% of the hydrogen of the phenolic hydroxyl group was replaced with a tert-butoxycarbonyl group.

In 37 g of methyl 3-methoxypropionate were dissolved 10 g of the above polymer, 0.2 g of triphenylsulfonium trifluorometanesulfonate and 0.02 g of diaminodiphenylmethane. The solution was filtered through a 0.2 μm filter to prepare a composition solution. The composition solution was coated on a silicon wafer. The coated wafer was subjected to baking at 100° C. for 2 minutes to obtain a resist film of 1.0 μm in thickness on the wafer.

The resist film was irradiated with an excimer laser having a wavelength of 248 nm at an exposure of 30 mJ.cm$^{-2}$ using a stepper. Immediately after the irradiation, the film was subjected to after-exposure baking at 90° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 1. When the resist pattern was heated on a hot plate at 150° C. for 2 minutes, no change in pattern shape was seen.

Comparative Example 1

A composition solution was prepared by repeating the procedure of Example 1, except that no diaminodiphenylmethane was added. Pattern formation was conducted in the same manner as in Example 1, except that the exposure in which excimer laser was applied was changed. The results are shown in Table 1. A line-and-space pattern of 0.35 μm was obtained when irradiation was effected in an exposure of 5 mJ.cm$^{-2}$, but the upper side of the pattern cross-section had a shape like a visor. Further, when the time from exposure to after-exposure baking was 2 hours, an insoluble layer was formed on the resist surface, and no pattern image was obtained.

EXAMPLE 2

In acetone was dissolved 54 g of a poly(hydroxystyrene). To the resulting solution were added 27 g of tert-butyl bromoacetate, 10 g of potassium carbonate and 9 g of potassium iodide. The resulting mixture was subjected to reaction for 7 hours with stirring under reflux. After completion of the reaction, the reaction mixture was dropwise added to water to precipitate a polymer. The polymer was separated and dried overnight at 50° C. in a vacuum dryer. The polymer obtained had a Mw of 18,000 and a Mw/Mn of 1.87. NMR analysis indicated that the polymer had a structure in which 22% of the hydrogen of the phenolic hydroxyl group was replaced with a tert-butyl acetate residue.

In 37 g of methyl 3-methoxypropionate were dissolved 10 g of the above polymer, 0.1 g of triphenylsulfonium trifluoromethanesulfonate and 0.02 g of dibenzoylthiamine. The solution was filtered through a 0.2 μm filter to prepare a composition solution. The composition solution was coated on a silicon wafer. The coated wafer was subjected to baking at 90° C. for 2 minutes to obtain a resist film of 1.0 μm in thickness on the wafer.

The resist film was irradiated with an excimer laser having a wavelength of 248 nm in an exposure of 52 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 1. When the resist pattern was heated on a hot plate at 150° C. for 2 minutes, no change in pattern shape was seen.

Comparative Example 2

A composition solution was prepared by repeating the procedure of Example 2, except that no dibenzoylthiamine was added. Pattern formation was conducted in the same manner as in Example 2. As shown in Table 1 an insoluble layer was formed on the resist surface, making pattern formation impossible.

EXAMPLE 3

In ethyl acetate was dissolved 107 g of a maleic acid/styrene copolymer (maleic acid/styrene=½ by mole). To the solution. were added 50 g of 3,4-dihydro-2H-pyran and 0.1 g of p-toluenesulfonic acid. The resulting solution was subjected to reaction at 5° C. for 3 hours with stirring. After completion of the reaction, the reaction mixture was mixed with distilled water. p-Toluenesulfonic acid was separated using a separatory funnel. The remainder was dropwise added to hexane to precipitate a polymer. The polymer was separated and dried overnight at 50° C. in a vacuum dryer. The polymer had a Mw of 11,000 and a Mw/Mn of 2.1. NMR analysis indicated that the polymer had a structure in which 52% of the carboxy group of maleic acid was replaced with a tetrahydropyranyl group.

In 37 g of methyl 3-methoxypropionate were dissolved 10 g of the above polymer, 0.2 g of triphenylsulfonium hexafluoroantimonate and 0.03 g of thiabendazole (another name for 2-(4-thiazolyl)benzimidazole). The solution was filtered through a 0.2 μm filter to prepare a composition solution. The composition solution was coated on a silicon wafer. The coated wafer was subjected to baking at 100° C. for 2 minutes to obtain a resist film of 1.0 μm in thickness on the wafer.

The resist film was irradiated with an excimer laser having a wavelength of 248 nm in an exposure of 38 mJ.cm$^{-2}$ using a stepper. Immediately after the irradiation, the film was subjected to after-exposure baking at 90° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 1. When the resist pattern was heated on a hot plate at 140° C. for 2 minutes, no change in pattern shape was seen.

Comparative Example 3

A composition solution was prepared by repeating the procedure of Example 3, except that no thiabendazole was added. Pattern formation was conducted in the same manner as in Example 3, except that the exposure in which an excimer laser was applied was changed. The results are shown in Table 1. A line-and-space pattern of 0.4 μm was obtained when irradiation was made at an exposure of 5 mJ.cm$^{-2}$, but the upper side of the pattern cross-section had a shape like a visor. Further, when the time from exposure to after-exposure baking was 2 hours, an insoluble layer was formed on the resist surface, making pattern formation impossible.

EXAMPLE 4

In acetone was dissolved 54 g of cresol novolak (m-/p-= 6/4). To the solution were added 27 g of tert-butyl bromoacetate, 10 g of potassium carbonate and 9 g of potassium iodide. The resulting mixture was subjected to reaction for 7 hours with stirring under reflux. After completion of the reaction, the reaction mixture was dropwise added to water to precipitate a polymer. The polymer was separated and dried overnight at 50° C. in a vacuum dryer. The polymer obtained had a Mw of 5,600 and a Mw/Mn of 4.8. NMR analysis indicated that the polymer had a structure in which 22% of the hydrogen of the phenolic hydroxyl group was replaced with a tert-butyl acetate residue.

In 37 g of methyl 3-methoxypropionate were dissolved 10 g of the above polymer, 0.1 g of triphenylsulfonium trifluoromethanesulfonate and 0.02 g of nicotinamide. The solution was filtered through a 0.2 μm filter to prepare a composition solution. The composition solution was coated on a silicon wafer. The coated wafer was subjected to baking at 90° C. for 2 minutes to obtain a resist film of 1.0 μm in thickness on the wafer.

The resist film was irradiated with an excimer laser having a wavelength of 248 nm in an exposure of 31 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 1. When the resist pattern was heated on a hot plate at 150° C. for 2 minutes, no change in pattern shape was seen.

EXAMPLE 5

In 37 g of methyl 3-methoxypropionate were dissolved 10 g of a poly(hydroxystyrene) (Mw=9,000), 4 g of 2,6-bismethylol-p-cresol, 0.3 g of triphenylsulfonium trifluoromethanesulfonate and 0.03 g of diaminodiphenyl ether. The resulting solution was filtered through a 0.2 μm filter to obtain a composition solution. The composition solution was coated on a silicon wafer. The coated wafer was then subjected to baking at 90° C. for 2 minutes to form a resist film having a film thickness of 1.0 μm, on the wafer.

The resist film was irradiated with an excimer laser having a wavelength of 248 nm in an exposure of 15 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting negative pattern gave good results as shown in Table 1. When the resist pattern was heated on a hot plate at 150° C. for 2 minutes, no change in pattern shape was seen.

Comparative Example 4

A composition solution was prepared by repeating the same procedure as in Example 5, except that no diaminodiphenyl ether was added. Pattern formation was conducted in the same manner as in Example 5, except that the exposure in which an excimer laser was applied. The results are shown in Table 1. When irradiation was conducted at an exposure of 5 mJ.cm$^{-2}$, a line-and-space pattern of 0.4 μm was formed, but particulate projections having diameters of about 0.02–0.05 μm were present on the pattern surface and the pattern shape was not suitable for micro engineering. When the time from exposure to after-exposure baking was 6 hours, a pattern of 0.6 μm was formed against the design size of 0.4 μm, in an exposure of 5 mJ.cm$^{-2}$.

hydroxyl group was replaced with a tert-butoxycarbonyl group.

In 37 g of methyl 3-methoxypropionate were dissolved 10 g of the above polymer, 0.2 g of triphenylsulfonium trifluoromethanesulfonate and 0.03 g of nicotinic acid. The resulting solution was filtered through a 0.2 μm filter to prepare a composition solution. The composition solution was spin-coated on a silicon wafer. The coated wafer was then subjected to baking at 100° C. for 2 minutes to form a resist film having a film thickness of 1.0 μm, on the wafer.

The resist film was irradiated with an excimer laser having a wavelength of 248 nm in an exposure of 20 mJ.cm$^{-2}$ using a stepper. Immediately after the irradiation, the film was subjected to after-exposure baking at 90° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 2. When the positive pattern was heated on a hot plate at 150° C. for 2 minutes, no change in pattern shape was seen.

EXAMPLE 7

In acetone was dissolved 54 g of a poly(hydroxystyrene). To the resulting solution were added 27 g of tert-butyl bromoacetate, 10 g of potassium carbonate and 9 g of

TABLE 1

| | When after-exposure baking was conducted immediately after exposure | | | | | | |
|---|---|---|---|---|---|---|---|
| | | | | | Focus | Process stability | |
| | Optimum exposure (mJ · cm$^{-2}$) | Resolution (μm) | Shape of pattern (B/A) | Adhesiveness | tolerance (μm) | Optimum exposure (mJ · cm$^{-2}$) | Shape of pattern (B/A) |
| Example 1 | 30 | 0.3 | Good (0.90) | Good | 1.2 | 29 | Good (0.92) |
| Example 2 | 27 | 0.3 | Good (0.93) | Good | 1.5 | 25 | Good (0.93) |
| Example 3 | 38 | 0.3 | Good (0.88) | Good | 1.2 | 38 | Good (0.89) |
| Example 4 | 31 | 0.3 | Good (0.88) | Good | 1.2 | 30 | Good (0.91) |
| Example 5 | 15 | 0.35 | Good (0.91) | Good | 1.2 | 18 | Good (0.89) |
| Comparative Example 1 | 5 | 0.35 | Bad (1.7) | Bad | 0.6 | — | Pattern formation was impossible. |
| Comparative Example 2 | — | — | Bad | — | — | — | Pattern formation was impossible |
| Comparative Example 3 | 10 | 0.4 | Bad (1.5) | Bad | 0.3 | — | Pattern formation was impossible |
| Comparative Example 4 | 5 | 0.4 | Particulate projections were present | Good | 0.9 | 3 | Particulate projections were present. |

Note:
The shape of pattern, adhesiveness and focus tolerance were those obtained at a line-and-space of 0.4 μm.

EXAMPLE 6

In tetrahydrofuran was dissolved 30 g of a poly(hydroxystyrene). To the resulting solution was added 10 g of potassium tert-butoxide, and 75 g of di-tert-butyl dicarbonate was further dropwise added at 0° C. with stirring. The resulting mixture was subjected to reaction for 6 hours. After completion of the reaction, the reaction mixture was dropwise added to water to precipitate a polymer. The polymer was separated and dried overnight at 50° C. in a vacuum dryer. The polymer obtained had a Mw of 30,000 and a Mw/Mn of 1.60. NMR analysis indicated that the polymer had a structure in which 63% of the hydrogen of the phenolic potassium iodide. The mixture was subjected to reaction for 7 hours with stirring under reflux. After completion of the reaction, the reaction mixture was dropwise added to water to precipitate a polymer. The polymer was dried at 50° C. overnight in a vacuum dryer. The polymer obtained had a Mw of 18,000 and a Mw/Mn of 1.87. NMR analysis indicated that the polymer had a structure in which 22% of the hydrogen of the phenolic hydroxyl group was replaced with a tert-butyl acetate residue.

In 37 g of methyl 3-methoxypropionate were dissolved 10 g of the above polymer, 0.1 g of triphenylsulfonium trifluoromethanesulfonate and 0.04 g of 2-hydroxypyridine. The resulting solution was filtered through a 0.2 μm filter to prepare a composition solution. The composition solution was spin-coated on a silicon wafer. The coated wafer was then subjected to baking at 90° C. for 2 minutes to form a resist film having a film thickness of 1.0 μm, on the wafer.

The resist film was irradiated with an excimer laser having a wavelength of 248 nm in an exposure of 25 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 2. When the positive pattern was heated on a hot plate at 150° C. for 2 minutes, no change in pattern shape was seen.

EXAMPLE 8

In ethyl acetate was dissolved 107 g of a maleic acid/styrene copolymer (maleic acid/styrene=½ by mole). To the resulting solution were added 50 g of 3,4-dihydro-2H-pyran and 0.1 g of p-toluenesulfonic acid. The solution was subjected to reaction at 5° C. for 3 hours with stirring. After completion of the reaction, the reaction mixture was mixed with distilled water. p-Toluenesulfonic acid was separated using a separatory funnel. The remainder was dropwise added to hexane to precipitate a polymer. The polymer was separated and dried at 50° C. overnight in a vacuum dryer. The polymer obtained had a Mw of 11,000 and a Mw/Mn of 2.1. NMR analysis indicated that the polymer had a structure in which 52% of the carboxylic acid of maleic acid was replaced with a tetrahydropyranyl group.

In 37 g of methyl 3-methoxypropionate were dissolved 10 g of the above polymer, 0.2 g of triphenylsulfonium hexafluoroantimonate and 0.03 g of nicotinic acid. The resulting solution was filtered through a 0.2 μm filter to prepare a composition solution. The composition solution was spin-coated on a silicon wafer. The coated wafer was then subjected to baking at 100° C. for 2 minutes to form a resist film having a film thickness of 1.0 μm, on the wafer.

The resist film was irradiated with an excimer laser having a wavelength of 248 nm in an exposure of 35 mJ.cm$^{-2}$ using a stepper. Immediately after the irradiation, the film was subjected to after-exposure baking at 90° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 2. When the positive pattern was heated on a hot plate at 140° C. for 2 minutes, no change in pattern shape was seen.

EXAMPLE 9

In acetone was dissolved 54 g of cresol novolak (m-/p-=6/4). To the resulting solution were added 27 g of tert-butyl bromoacetate, 10 g of potassium carbonate and 9 g of potassium iodide. The mixture was subjected to reaction for 7 hours with stirring under reflux. After completion of the reaction, the reaction mixture was dropwise added to water to precipitate a polymer. The polymer was separated and dried at 50° C. overnight in a vacuum dryer. The polymer obtained had a Mw of 5,600 and a Mw/Mn of 4.8. NMR analysis indicated that 22% of the hydrogen of the phenolic hydroxyl group was replaced with a tert-butyl acetate residue.

In 37 g of methyl 3-methoxypropionate were dissolved 10 g of the above polymer, 0.1 g of triphenylsulfonium trifluoromethanesulfonate and 0.02 g of nicotinic acid. The resulting solution was filtered through a 0.2 μm filter to prepare a composition solution. The composition solution was spin-coated on a silicon wafer. The coated wafer was then subjected to baking at 90° C. for 2 minutes to form a resist film having a film thickness of 1.0 μm, on the wafer.

The resist film was irradiated with an excimer laser having a wavelength of 248 nm in an exposure of 30 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting positive pattern gave good results as shown in Table 2. When the positive pattern was heated on a hot plate at 150° C. for 2 minutes, no change in pattern shape was seen.

EXAMPLE 10

In 37 g of methyl 3-methoxypropionate were dissolved 10 g of a poly(hydroxystyrene) (Mw=9,000), 4 g of 2,6-bismethylol-p-cresol, 0.3 g of triphenylsulfonium trifluoromethanesulfonate and 0.03 g of L-phenylalanine. The resulting solution was filtered through a 0.2 μm filter to prepare a composition solution. The composition solution was spin-coated on a silicon wafer. The coated wafer was then subjected to baking at 90° C. for 2 minutes to form a resist film having a film thickness of 1.0 μm, on the wafer.

The resist film was irradiated with an excimer laser having a wavelength of 248 nm in an exposure of 20 mJ.cm$^{-2}$ using a stepper. Immediately after the irradiation, the film was subjected to after-exposure baking at 100° C. for 2 minutes, after which the film was subjected to development with an aqueous solution containing 2.38% by weight of tetramethylammonium hydroxide at 23° C. for 60 seconds and then rinsed with water for 30 seconds. The resulting negative pattern gave good results as shown in Table 2. When the negative pattern was heated on a hot plate at 150° C. for 2 minutes, no change in pattern shape was seen.

EXAMPLE 11

In methyl 3-methoxypropionate, 50 g of a poly(4-hydroxystyrene) (Mw=34,000) was reacted with hexamethyldisilazane at 90° C. for 6 hours. After completion of the reaction, the reaction mixture was concentrated under reduced pressure until the polymer concentration became 20% by weight. The resulting polymer solution was subjected to NMR analysis, the results of which indicated that the polymer in the solution had a structure in which 40% of the phenolic hydroxyl group of the poly(4-hydroxystyrene) was protected with a trimethylsilyl group. In 10 g of the solution were dissolved 0.06 g of triphenylsulfonium trifluoromethanesulfonate and 0.01 g of nicotinic acid. The resulting solution was filtered through a 0.2 μm filter to obtain a composition solution. The composition solution was spin-coated on a silicon wafer. The coated wafer was subjected to baking at 110° C. for 2 minutes to form a resist film having a film thickness of 1.0 μm, on the wafer.

The resist film was irradiated with an excimer laser having a wavelength of 248 nm in an exposure of 30 mJ.cm$^{-2}$ using a stepper. Immediately after the irradiation, the film was subjected to after-exposure baking, development and rinsing in the same manner as in Example 6. The resulting positive pattern gave good results as shown in Table 2.

TABLE 2

| | When after-exposure baking was conducted immediately after exposure | | | | Focus tolerance (μm) | Process stability | |
|---|---|---|---|---|---|---|---|
| | Optimum exposure (mJ · cm$^{-2}$) | Resolution (μm) | Shape of pattern (B/A) | Adhesiveness | | Optimum exposure (mJ · cm$^{-2}$) | Shape of pattern (B/A) |
| Example 6 | 20 | 0.3 | Good (0.92) | Good | 1.5 | 18 | Good (0.92) |
| Example 7 | 25 | 0.3 | Good (0.89) | Good | 1.0 | 25 | Good (0.91) |
| Example 8 | 35 | 0.3 | Good (0.91) | Good | 1.2 | 30 | Good (0.92) |
| Example 9 | 30 | 0.3 | Good (0.90) | Good | 1.2 | 30 | Good (0.90) |
| Example 10 | 20 | 0.35 | Good (0.88) | Good | 1.0 | 18 | Good (0.88) |
| Example 11 | 30 | 0.3 | Good (0.90) | Good | 1.5 | 28 | Good (0.90) |

Note:
The shape of pattern, adhesiveness and focus tolerance were those obtained at a line-and-space of 0.4 μm.

What is claimed is:

1. A chemically amplified negative resist, comprising:
   (i) a poly(hydroxystyrene) as an alkali-soluble resin;
   (ii) a triphenylsulfonium trifluoromethanesulfonate as a radiation-sensitive, acid-generating agent;
   (iii) a diaminodiphenyl ether or an L-phenylalanine as a compound having a nitrogen-containing basic group; and
   (iv) 2,6-bismethylol-p-cresol as a compound capable of cross-linking the alkali-soluble resin in the presence of an acid.

2. The chemically amplified negative resist of claim 1, wherein said poly(hydroxystyrene) is a copolymer which contains at least 15% by mol of a repeating unit derived from a hydroxystyrene as a monomer.

3. The chemically amplified negative resist of claim 2, wherein said poly(hydroxstyrene) is amount of a copolymer which contains 20% by mol or more of a repeating unit derived from a hydroxystyrene as a monomer.

4. The chemically amplified negative resist of claim 1, wherein said poly(hydroxystrene) has a molecular weight of 1,000 to 150,000 in terms of polystyrene-reduced weight average molecular weight as measured by gel permeation chromatography.

5. The chemically amplified negative resist of claim 1, wherein said triphenylsulfonium trifluoromethanesulfonate is used in an amount of about 1 to 70 parts by weight per 100 parts by weight of said poly(hydroxystyrene).

6. The chemically amplified negative resist of claim 5, wherein said triphenylsulfonium trifluoromethanesulfonate is used in an amount of about 3 to 50 parts by weight per 100 parts of weight of said poly(hydroxystyrene).

7. The chemically amplified negative resist of claim 1, wherein said diaminodiphenylether or said L-phenylalanine is used in an amount of 0.001 to 10 parts by weight per 100 parts by weight of said poly(hydroxystyrene).

8. The chemically amplified negative resist of claim 7, wherein said diaminodiphenylether or said L-phenylalanine is used in an amount of 0.01 to 5 parts by weight per 100 parts by weight of said poly(hydroxystyrene).

9. The chemically amplified negative resist of claim 1, wherein said 2,6-bismethylol-p-cresol is used in an amount of from 5 to 95 parts by weight per 100 parts by weight of said poly(hydroxystyrene).

10. The chemically amplified negative resist of claim 9, wherein said 2,6-bismethylol-p-cresol is used in an amount of from 15 to 85 parts by weight per 100 parts by weight of said poly(hydroxystyrene).

* * * * *